United States Patent
Nishikawara

(10) Patent No.: US 7,630,056 B2
(45) Date of Patent: Dec. 8, 2009

(54) EXPOSURE APPARATUS AND DEVICE MANUFACTURING METHOD

(75) Inventor: Tomofumi Nishikawara, Kawachi-gun (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 12/188,168

(22) Filed: Aug. 7, 2008

(65) Prior Publication Data

US 2009/0040481 A1 Feb. 12, 2009

(30) Foreign Application Priority Data

Aug. 8, 2007 (JP) .............................. 2007-206531

(51) Int. Cl.
*G03B 27/42* (2006.01)
*G03B 27/58* (2006.01)

(52) U.S. Cl. .......................................... 355/53; 355/72

(58) Field of Classification Search .................. 355/30, 355/53, 72; 250/548

See application file for complete search history.

(56) References Cited

U.S. PATENT DOCUMENTS 7,199,858 B2 * 4/2007 Lof et al. ....................... 355/30
7,349,064 B2 3/2008 Nakano 2007/0109521 A1 5/2007 Nishii et al.
2007/0146666 A1 6/2007 Leenders et al.
2007/0269294 A1 11/2007 Nagasaka et al.
2008/0271747 A1* 11/2008 De Jong et al. ................ 134/1

FOREIGN PATENT DOCUMENTS

| JP | 2004-289127 A | 10/2004 |
|----|---------------|---------|
| JP | 2006-074061 A | 3/2006 |
| JP | 2006-310588 A | 11/2006 |
| JP | 2007-194613 A | 8/2007 |
| WO | 2005/059977 A1 | 6/2005 |
| WO | 2006/030908 A1 | 3/2006 |

* cited by examiner

*Primary Examiner*—Hung Henry Nguyen
(74) *Attorney, Agent, or Firm*—Canon U.S.A., Inc., IP Division

(57) ABSTRACT

An exposure apparatus that exposes a substrate via liquid includes a substrate stage configured to hold the substrate and to move. The substrate stage includes a top plate, a substrate holder disposed on the top plate and configured to hold the substrate, and a support-plate holder disposed on the top plate as a separate body from the substrate holder and configured to hold a support plate while surrounding the substrate held by the substrate holder. The substrate holder includes an extension having a surface facing a back surface of the support plate held by the support-plate holder. The support-plate holder is provided with a collecting port therein through which liquid that has entered a gap between the back surface of the support plate and the surface of the extension is collected.

5 Claims, 6 Drawing Sheets

EXPOSURE APPARATUS AND DEVICE MANUFACTURING METHOD

BACKGROUND OF THE INVENTION

1. Field of the Invention

The present invention relates to exposure apparatuses that exposes a substrate via liquid and device manufacturing methods using such exposure apparatuses.

2. Description of the Related Art

There are known exposure apparatuses in which a circuit pattern formed on a reticle is transferred to a wafer by projection exposure using a projection optical system. In recent years, there have been increasing demands for provision of exposure apparatuses having a higher resolution. In response to such demands for a higher resolution, immersion exposure has been attracting attention.

For the purpose of performing immersion exposure in exposure apparatuses, a local-fill method has been proposed, in which liquid is supplied locally between a final surface of the projection optical system and the wafer surface. In a local-fill exposure apparatus, a liquid supplying device supplies liquid through a supply nozzle to a space between the final surface of the projection optical system and the wafer surface, and a liquid collecting device collects the supplied liquid through a collecting nozzle.

In the local-fill method, a central region of the wafer can be exposed in a satisfactory manner without overflow or lack of liquid, whereas exposure on a peripheral region of the wafer may cause some of the liquid to flow off the wafer. To receive the liquid flowing off the wafer, a plate having a surface level substantially the same as that of the wafer (hereinafter referred to as a support plate) is disposed around the wafer. Even with such a support plate, some of liquid may fall into a gap between the wafer and the support plate. If the liquid that has fallen in such a way adheres to a member around the wafer and vaporizes thereon, the vaporization absorbs heat from the member. Consequently, the member may undergo thermal deformation. If a large amount of liquid falls into the gap, the liquid may overflow from the gap and spread inside the exposure apparatus. In such a case, members constituting the exposure apparatus may be corroded. Moreover, the spread liquid vaporizes and thus leaves watermarks. Such watermarks may undesirably cause contamination of members constituting the exposure apparatus.

Therefore, it is necessary to reduce the amount of liquid that falls into the gap and to collect any fallen liquid. To collect the liquid fallen into the gap, configurations in which a liquid collecting unit is disposed in the gap have been disclosed (see International Publication Nos. WO2006/030908 and WO2005/059977, and Japanese Patent Laid-Open Nos. 2004-289127 and 2007-194613).

FIG. 6 is a schematic cross-sectional view showing a part around a wafer 40 in a known immersion exposure apparatus. In FIG. 6, a space between a projection optical system 30 and the wafer 40 is filled with liquid LW. The wafer 40 is supported from the back thereof by a surface 301 of a wafer holder 302, and is tightly secured thereto by being attracted with vacuum. The wafer holder 302 is secured to a top plate 303. A support plate 43 is disposed on the wafer holder 302 in such a manner as to surround the wafer 40 and to have a surface level substantially the same as that of the wafer 40. In this case, the wafer 40 and the support plate 43 are both held on a single wafer holder 302. Further, by giving liquid-repellency to the top surface of the support plate 43, the amount of liquid that remains on the top surface of the support plate 43 after exposing a peripheral region of the wafer 40 is reduced.

A collecting port 304 applies suction to and collects the liquid LW that has fallen into a gutter 300, and is connected to a suction device 308 through a collecting tube 305. The suction device 308 is constituted by a gas-liquid separation device 306 and a pressure reduction source 307. A gap g between the wafer 40 and the support plate 43 is adjusted to be about 0.1 mm to 2 mm.

In the known immersion exposure apparatus, however, the gap g between the wafer 40 and the support plate 43 is large. Therefore, during execution of exposure on a peripheral region of the wafer 40, a large amount of liquid LW falls into the gutter 300. This may cause overflow of the liquid LW from the gap g when a wafer stage 41 is moved and spreading of the overflowed liquid LW over the support plate 43 and the wafer 40, thereby contaminating members constituting the exposure apparatus.

In addition, when the liquid LW fallen into the gutter 300 is collected through the collecting port 304 by applying suction using the suction device 308, vaporization of the liquid LW is promoted. This vaporization absorbs heat from the wafer holder 302 having the liquid LW thereon, whereby the wafer holder 302 and the wafer 40 may become deformed. Consequently, exposure accuracy of the immersion exposure apparatus may be degraded.

SUMMARY OF THE INVENTION

The present invention provides an exposure apparatus capable of realizing high exposure accuracy by reducing the amount of liquid that falls into a gap between a wafer and a support plate and by suppressing the influence of heat absorption by vaporization occurring during collection of the fallen liquid.

According to an aspect of the present invention, an exposure apparatus that exposes a substrate via liquid includes a substrate stage configured to hold the substrate and to move. The substrate stage includes a top plate, a substrate holder disposed on the top plate and configured to hold the substrate, and a support-plate holder disposed on the top plate as a separate body from the substrate holder and configured to hold a support plate while surrounding the substrate held by the substrate holder. The substrate holder includes an extension having a surface facing a back surface of the support plate held by the support-plate holder. The support-plate holder is provided with a collecting port therein through which liquid that has entered a gap between the back surface of the support plate and the surface of the extension is collected.

Further features of the present invention will become apparent from the following description of exemplary embodiments with reference to the attached drawings.

DESCRIPTION OF THE EMBODIMENTS

Preferred embodiments of the present invention will now be described in detail with reference to the attached drawings.

First Embodiment

Figure 4:
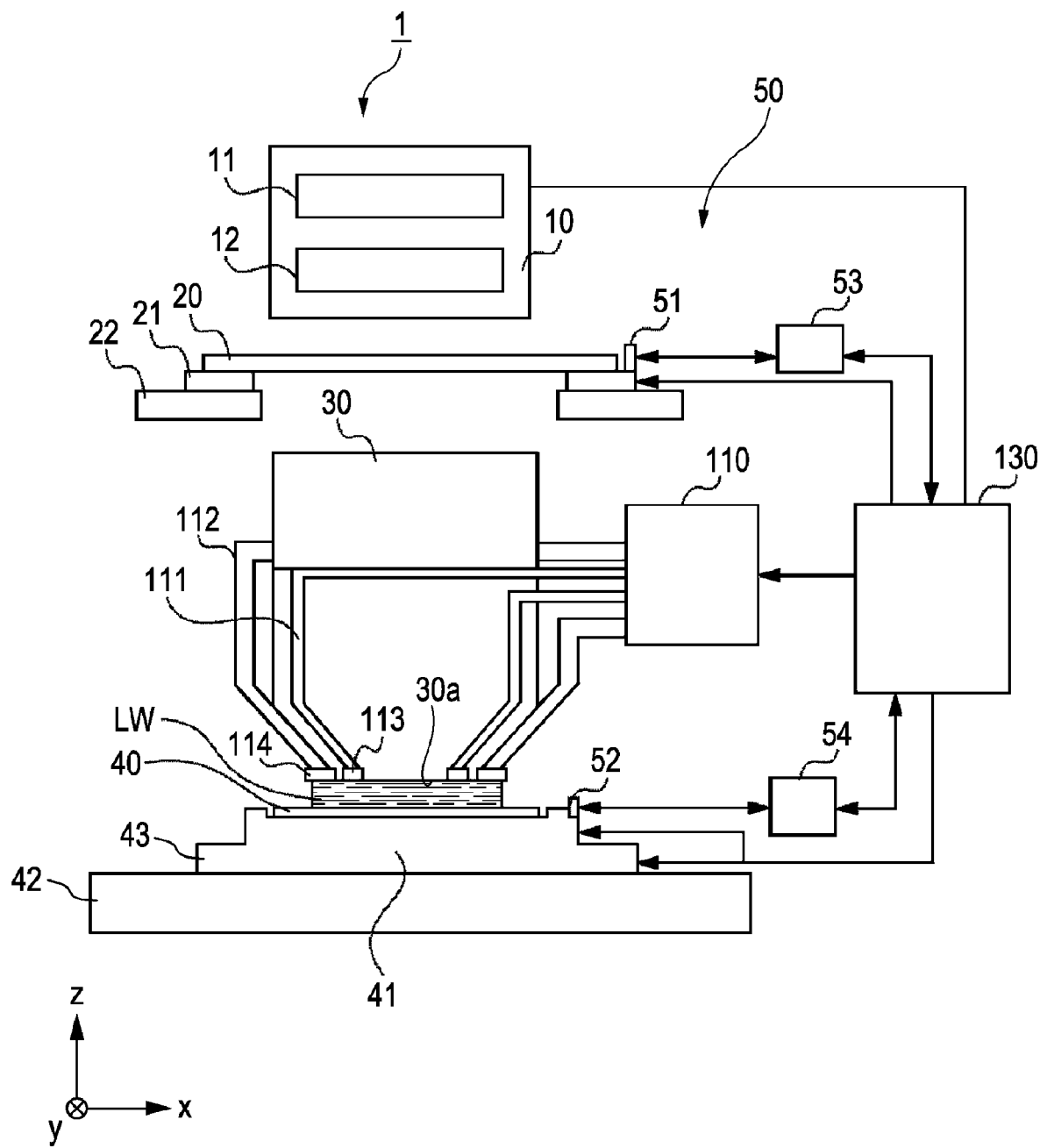
FIG. 4 is a schematic cross-sectional view of the exposure apparatus according to the first embodiment.

FIG. 4 is a schematic cross-sectional view of an exposure apparatus 1 according to a first embodiment.

Hereinafter, components of the same or an equivalent kind will be denoted by the same reference numeral and redundant description will be omitted.

The exposure apparatus 1 is an immersion exposure apparatus in which a circuit pattern formed on a reticle (mask) 20 is transferred to a wafer 40 by exposure while liquid LW is supplied into a space between a final surface (final lens) 30a of a projection optical system 30 and the wafer 40, the final surface 30a residing at the position nearest to the wafer 40. Alternatively, instead of the exposure apparatus 1 of the first embodiment that exposes the wafer 40 by the step-and-scan method, an exposure apparatus that exposes the wafer 40 by the step-and-repeat method may be used.

As shown in FIG. 4, the exposure apparatus 1 includes an illumination device 10, a reticle stage 21 on which the reticle 20 is to be mounted, the projection optical system 30, and a wafer stage 41 on which the wafer 40 is to be mounted. The exposure apparatus 1 further includes an support plate 43, a distance measuring device 50, and a liquid supplying/collecting device 110. The support plate 43 is so disposed as to surround the wafer 40, and has a surface level adjusted to be substantially the same as that of the wafer 40.

The illumination device 10 includes a light source 11 and an illumination optical system 12.

The light source 11 in the first embodiment is an ArF excimer laser using a wavelength of about 193 nm. Alternatively, a light source of another type such as a KrF excimer laser using a wavelength of about 248 nm or an F2 laser using a wavelength of about 157 nm may be used.

The illumination optical system 12 illuminates the reticle 20 with the light emitted from the light source 11.

The reticle 20, serving as an original, is made of quartz and has a circuit pattern formed thereon. The circuit pattern is to be transferred to the wafer 40 by exposure.

The reticle stage (original stage) 21 is mounted on a base 22 provided for securing the reticle stage 21. The reticle stage 21 supports the reticle 20 with a reticle chuck interposed therebetween. The reticle stage 21 is moved by a moving mechanism (not shown) and is controlled by a control unit, which will be described separately below.

The projection optical system 30 projects the pattern on the reticle 20 onto the wafer 40. The projection optical system 30 may be either a dioptric system or a catadioptric system.

The wafer 40 is conveyed by a wafer conveying system (not shown) from the outside of the exposure apparatus 1, and is supported and moved by the wafer stage 41. In the first embodiment, the substrate to be subjected to exposure is the wafer 40. The substrate to be subjected to exposure may also be a glass plate or a liquid crystal substrate. The wafer 40 has a photoresist applied thereto.

The wafer stage (substrate stage) 41 is secured to a base 42 and supports the wafer 40 with a wafer holder interposed therebetween. The wafer stage 41 has a function for adjusting the vertical position (in a direction along the optical axis of the projection optical system 30), turning direction, and inclination of the wafer 40, and is controlled by a stage control unit. During exposure on the wafer 40, the wafer stage 41 is controlled by the stage control unit in such a manner that the focal plane of the projection optical system 30 is maintained to coincide with the surface of the wafer 40 with high accuracy.

The distance measuring device 50 measures the two-dimensional positions of the reticle stage 21 and the wafer stage 41 in real time by using reference mirrors 51 and 52 and laser interferometers 53 and 54. Measurements obtained by the distance measuring device 50 are transmitted to a control unit 130, which will be described separately below. The reticle stage 21 and the wafer stage 41 are driven under the control of the control unit 130 at a constant speed ratio during positioning and synchronous operation thereof.

The support plate 43 provides a surface flush with the surface of the wafer 40, and is mounted on the wafer stage 41 in such a manner as to surround the wafer 40 and to have a surface level substantially the same as that of the wafer 40.

The liquid LW can be selected from ones that absorb less exposure light, and have as high a refractive index as possible. Specifically, pure water, fluorinated liquid, organic liquid, or the like can be used as the liquid LW.

The liquid supplying/collecting device 110 includes a supply tube 111, a collecting tube 112, a supply nozzle 113, and a collecting nozzle 114, which are used for supplying or collecting the liquid LW to or from the space between the final surface 30a of the projection optical system 30 and the wafer 40. The liquid supplying/collecting device 110 is controlled by the control unit 130. The liquid supplying/collecting device 110 supplies and collects the liquid LW even while the wafer stage 41 is being moved. Thus, the liquid LW can be maintained in a constant state between the projection optical system 30 and the wafer 40.

The control unit 130, which includes a central processing unit (CPU) and a memory both not shown, controls the operation of the exposure apparatus 1. The control unit 130 is electrically connected to the illumination device 10, the moving mechanism (not shown) of the reticle stage 21, a moving mechanism (not shown) of the wafer stage 41, and the liquid supplying/collecting device 110. The CPU includes any processor such as a microprocessor unit (MPU), and controls operations of the aforementioned components. The memory is constituted by a read-only memory (ROM) and a random access memory (RAM), and stores firmware that operates the exposure apparatus 1.

The control unit 130 may control the exposure operation in such a manner as, for example, to change the direction in which the supplied liquid LW flows in accordance with the movement of the wafer stage 41 during supply and collection of the liquid LW, or to supply and collect constant amounts of the liquid LW.

Figure 5A:
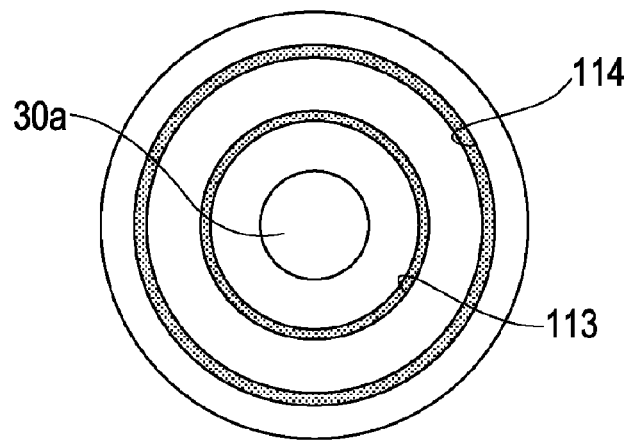
FIG. 5A is a bottom view of a liquid supplying/collecting nozzle of the exposure apparatus shown in FIG. 4.

The liquid supplying/collecting device 110 supplies the liquid LW through the supply tube 111 and the supply nozzle 113, and collects the liquid LW through the collecting tube 112 and the collecting nozzle 114. Now, a liquid supplying/collecting nozzle will be described with reference to FIGS. 5A to 5C. FIG. 5A is a bottom view of the liquid supplying/collecting nozzle. The supply nozzle 113 and the collecting nozzle 114 each have an annular shape surrounding the final surface 30a. The supply nozzle 113 and the collecting nozzle 114, each being shaped as a slit, may also be shaped as a pinhole or be made of a porous material.

Figure 5B:
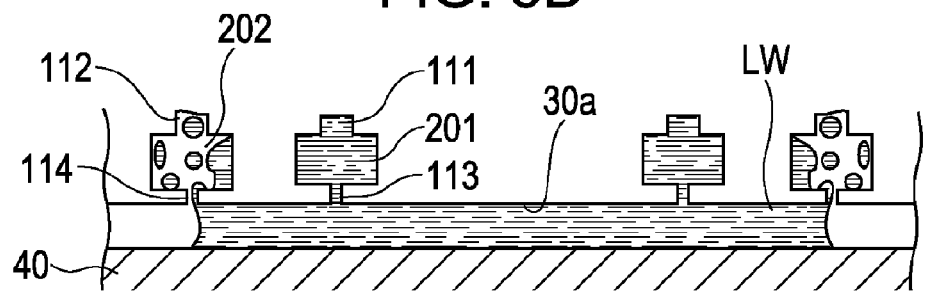
FIG. 5B is a cross-sectional view of the liquid supplying/collecting nozzle of the exposure apparatus shown in FIG. 4.

FIG. 5B is a cross-sectional view of the liquid supplying/collecting nozzle. The liquid LW is supplied sequentially through the supply tube 111, a buffer space 201, and the supply nozzle 113 to the space between the final surface 30a of the projection optical system 30 and the wafer 40. On the other hand, the liquid LW is collected sequentially through the collecting nozzle 114, a uniform-pressure chamber 202, and the collecting tube 112 from the space between the final surface 30a of the projection optical system 30 and the wafer 40. The collecting tube 112 is connected to a vacuum source, such as a dry vacuum pump.

Figure 5C:
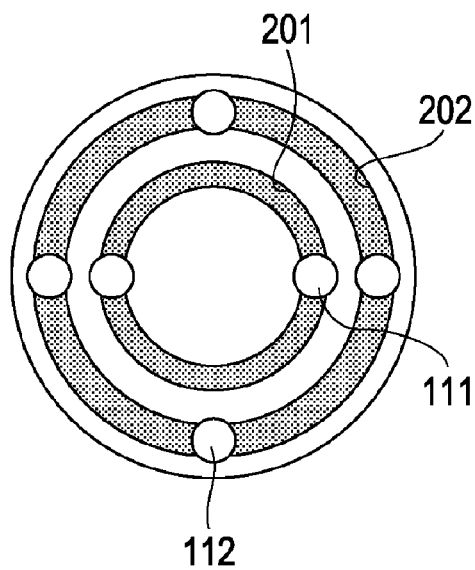
FIG. 5C is a top view of the liquid supplying/collecting nozzle of the exposure apparatus shown in FIG. 4.
Figure 6:
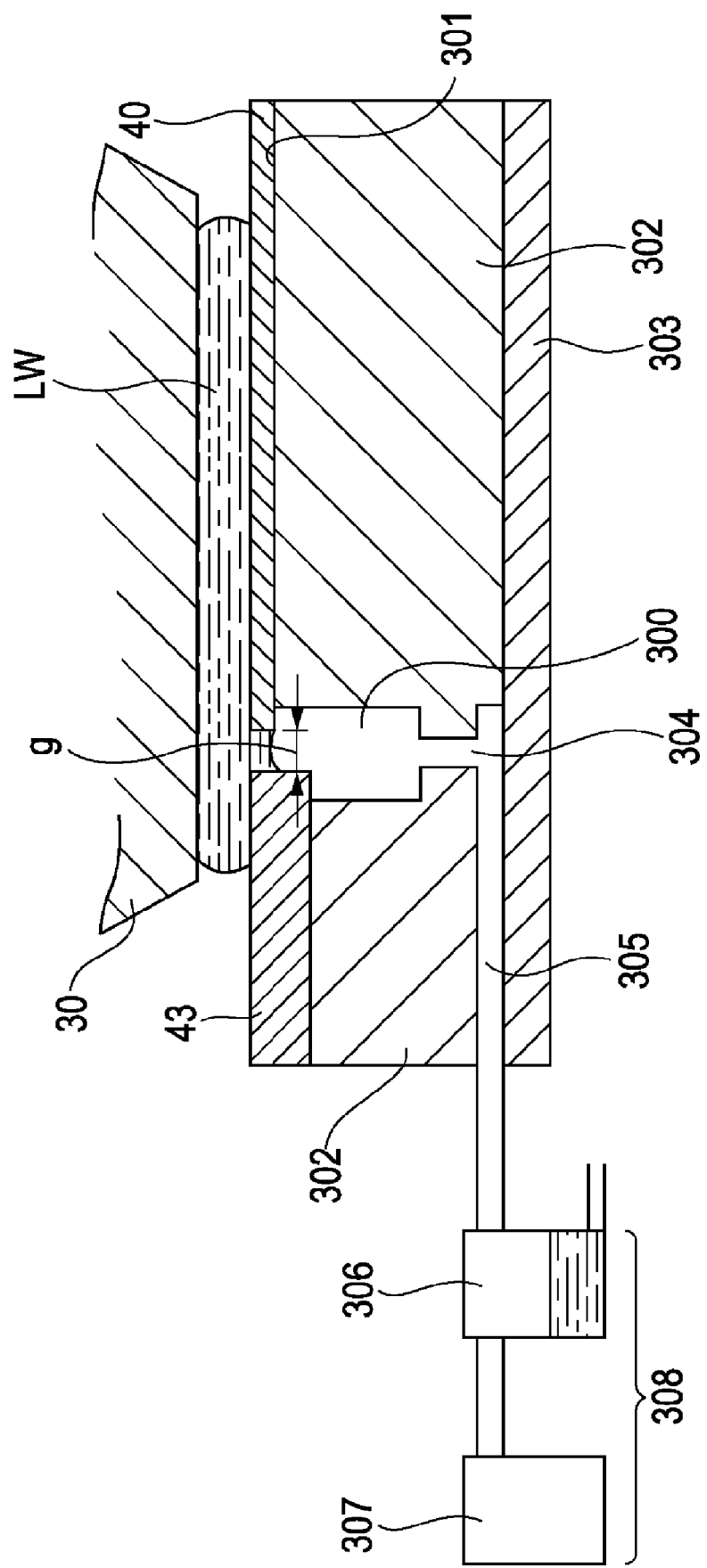
FIG. 6 is a schematic cross-sectional view of a part around a wafer in a known exposure apparatus.

FIG. 5C is a top view of the liquid supplying/collecting nozzle, showing the arrangement of the buffer space 201, the uniform-pressure chamber 202, the supply tube 111, and the collecting tube 112. The supply tube 111 and the collecting tube 112 are each provided in a plurality at positions in the annular shapes of the buffer space 201 and the uniform-pressure chamber 202, respectively. In the first embodiment, two supply tubes 111 and four collecting tubes 112 are provided. To realize uniform supply and collection of the liquid LW, the buffer space 201 and the uniform-pressure chamber 202 are provided between the supply nozzle 113 and the supply tubes 111 and between the collecting nozzle 114 and the collecting tubes 112, respectively. In the foregoing description of the liquid supplying/collecting nozzle, the supply nozzle 113 and the collecting nozzle 114 each are arranged in an annular shape. Alternatively, for example, liquid supplying/collecting nozzles may be provided on opposite sides of the final surface 30a. For example, see US Unexamined Patent Application Publication No. 2004/0263809 or Japanese Patent Laid-Open No. 2006-074061.

Figure 1:
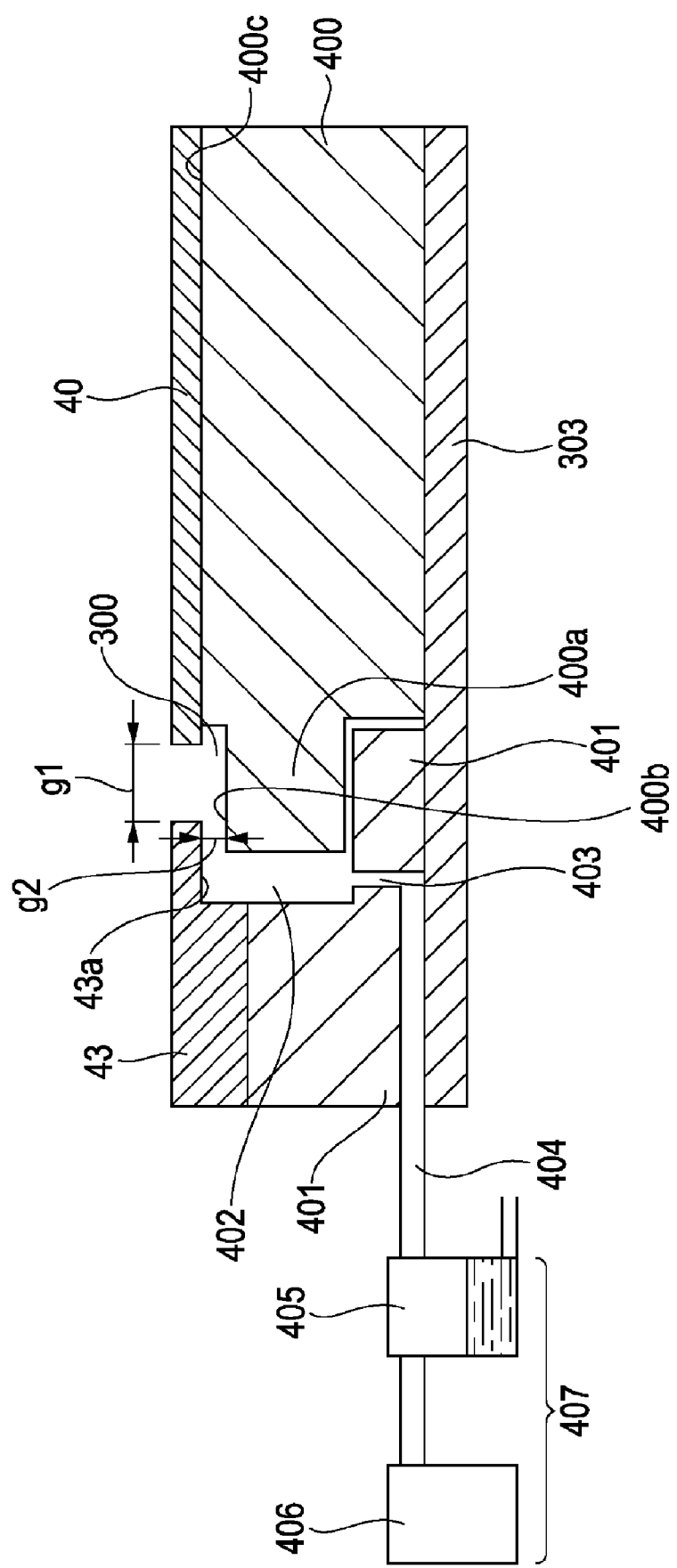
FIG. 1 is a schematic cross-sectional view of a part around a wafer in an exposure apparatus according to a first embodiment of the present invention.

Now, referring to FIG. 1, a method for reducing the amount of liquid LW that falls into a gutter 300 and a method for collecting the liquid LW that has gathered in the gutter 300 will be described. FIG. 1 is a schematic cross-sectional view of a part around the wafer 40 in the exposure apparatus according to the first embodiment. In the first embodiment, the wafer 40 and the support plate 43 are held by separate members. The wafer 40 is held by a wafer holder (substrate holder) 400, and the support plate 43 is held by a support-plate holder 401. Further, the wafer holder 400 is removable from a top plate 303. In particular, the wafer holder 400 can be removed from the top plate 303 while the support-plate holder 401 is secured to the top plate 303.

The wafer holder 400 includes an extension 400a positioned at a level below a surface 400c of the wafer holder 400. The surface 400c is the contact surface between the back surface of the wafer 40 and the wafer holder 400. When the wafer 40 is supported from the back thereof by a number of pins, the surface 400c corresponds to the head surfaces of the pins, and when the wafer 40 is supported from the back thereof by a plurality of rings concentric with the wafer 40, the surface 400c corresponds to the top surfaces of the rings. Since the surface level of the extension 400a is below that of the surface 400c, the extension 400a never touches the wafer 40. For example, when the wafer 40 is conveyed by an external conveying device onto the surface 400c, part of the wafer 40 may be placed outside the surface 400c and above the extension 400a because of conveyance errors and processing tolerances of the wafer 40. Even in such a case, in the first embodiment, the wafer 40 and the extension 400a are never in contact with each other. Thus, the wafer 40 can be held on the surface 400c with high accuracy.

A portion of the extension 400a faces a back surface 43a of the support plate 43, whereby a gap g2 is defined between the extension 400a and the support plate 43. The size of a gap g1 depends on not only the processing accuracy of relevant components but also the conveyance accuracy of the wafer 40 or the like. In particular, the processing tolerance of the wafer 40 is standardized. According to the standard processing tolerance, the minimum size of the gap g1 would be about 0.5 mm. On the other hand, the size of the gap g2 only depends on the processing accuracy of relevant components such as the wafer holder 400 and the support plate 43. Therefore, the gap g2 can be controlled with higher accuracy than in the case of the gap g1. For example, the gap g2 can be set to about 0.05 mm to 0.3 mm. This shows that the gap g2 can be made smaller than the gap g1. Further, the back surface 43a of the support plate 43 and a surface 400b of the extension 400a are made liquid-repellent. In the first embodiment, since the gap g2 is smaller than the gap g1, most of the liquid LW that has fallen through the gap g1 gathers in the gutter 300, and the amount of the liquid LW that falls through the gap g1 is determined by the capacity of the gutter 300. Particularly in the first embodiment, the surface 400b of the extension 400a is positioned about 20 µm to 30 µm below the surface 400c of the wafer holder 400. This means that the capacity of the gutter 300 is small. Hence, the amount of the liquid LW that falls into the gutter 300 is also small. Accordingly, spreading of the liquid LW from the gutter 300 over the wafer 40 and the support plate 43 while the wafer stage 41 is being moved can be prevented.

Next, a liquid collecting mechanism of the first embodiment will be described. The support-plate holder 401 is provided with a liquid collecting port through which the liquid LW that has flowed into a space 402 through the gap g2 is collected. The collecting port is constituted by a plurality of pinholes 403 annularly surrounding the wafer holder 400. The pinholes 403 extend vertically downward in the support-plate holder 401 and communicate with collecting tubes 404. The number of the pinholes 403 is larger than the number of the collecting tubes 404. A plurality of the pinholes 403 communicate with a single collecting tube 404. Further, to give a uniform liquid-collectability to all of the pinholes 403, the cross section of the collecting tube 404 is designed to be 20 to 30 times that of the pinhole 403. The collecting tubes 404 are connected to a suction device 407. The suction device 407 is constituted by a gas-liquid separation tank 405 and a pressure reduction source 406. The suction device 407 produces a negative pressure in the gas-liquid separation tank 405 with respect to the ambient pressure by activating the pressure reduction source 406, thereby collecting the liquid LW through the collecting tubes 404 into the gas-liquid separation tank 405.

In the liquid collecting mechanism of the first embodiment, since the wafer holder 400 and the support-plate holder 401 are separate bodies, temperature change due to heat absorption by vaporization occurring when suction is applied to the liquid LW through the pinholes 403 does not affect the wafer holder 400. The gas in the space 402 serves as a thermal resistor, thereby preventing temperature change occurring in the support-plate holder 401 from being transmitted to the wafer holder 400. Further, since the amount of the liquid LW that falls through the gap g1 is small, the amount of the liquid LW itself that vaporizes around the pinholes 403 is small.

Thus, not only the liquid LW that has flowed into the space 402 but also the liquid LW that has gathered in the gutter 300 can be collected through the pinholes 403. For example, the liquid LW that has gathered in the gutter 300 can be collected from the gap g2 by applying suction through the pinholes 403. This effectively prevents the liquid LW that has gathered in the gutter 300 from spreading over the wafer 40 and the support plate 43 while the wafer stage 41 is being moved.

To summarize, in the first embodiment, with the extension 400a provided to the wafer holder 400, the amount of the liquid LW that falls into the gutter 300 can be reduced. Further, with the collecting port provided in the support-plate holder 401, which is a separate body from the wafer holder 400, degradation of exposure accuracy due to heat absorption by vaporization occurring when suction is applied to the liquid LW can be suppressed.

Second Embodiment

Figure 2:
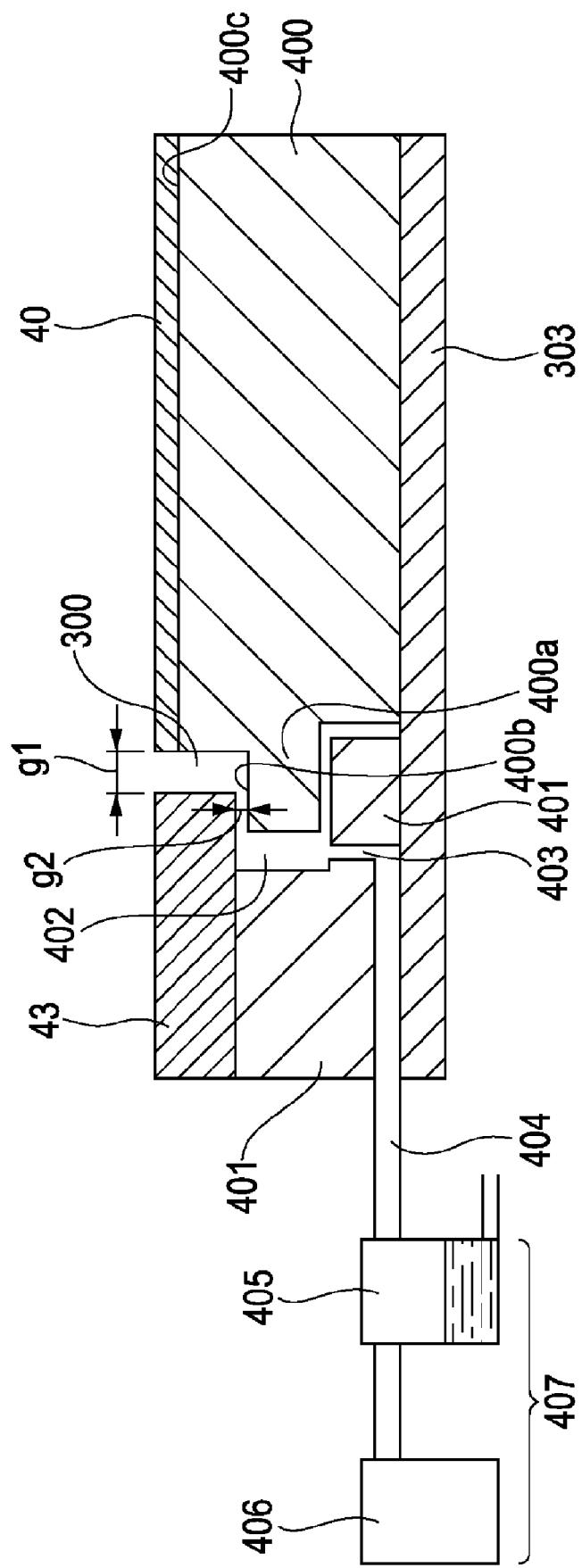
FIG. 2 is a schematic cross-sectional view of a part around a wafer in an exposure apparatus according to a second embodiment of the present invention.

Now, referring to FIG. 2, an exposure apparatus according to a second embodiment of the present invention will be described. FIG. 2 is a schematic cross-sectional view of a part around the wafer 40 in the exposure apparatus according to the second embodiment.

In FIG. 2, the support plate 43 is formed so as to be thicker than the wafer 40. Therefore, the support plate 43 is sufficiently strong and rigid to suppress degradation of accuracy in holding the wafer 40 caused by deformation and vibration of the support plate 43. The surface 400b of the extension 400a of the wafer holder 400 is positioned at a level below the surface 400c of the wafer holder 400. As in the case of the exposure apparatus according to the first embodiment, the gap g2 defined by the support plate 43 and the extension 400a of the wafer holder 400 is smaller than the gap g1.

When the thickness of the support plate 43 is increased, the capacity of the gutter 300 increases proportionally. Consequently, the amount of liquid LW that falls through the gap g1 also increases. Therefore, the thickness of the support plate 43 should be determined considering the strength and rigidity of the support plate 43 and the capacity of the gutter 300. For example, the thickness of the support plate 43 may be set to about 2 mm to 3 mm.

To summarize, in the exposure apparatus of the second embodiment, the support plate 43 is thicker than the wafer 40 and has an increased strength and rigidity, whereby degradation of accuracy in holding the wafer 40 caused by deformation and vibration of the support plate 43 can be suppressed.

Third Embodiment

Figure 3:
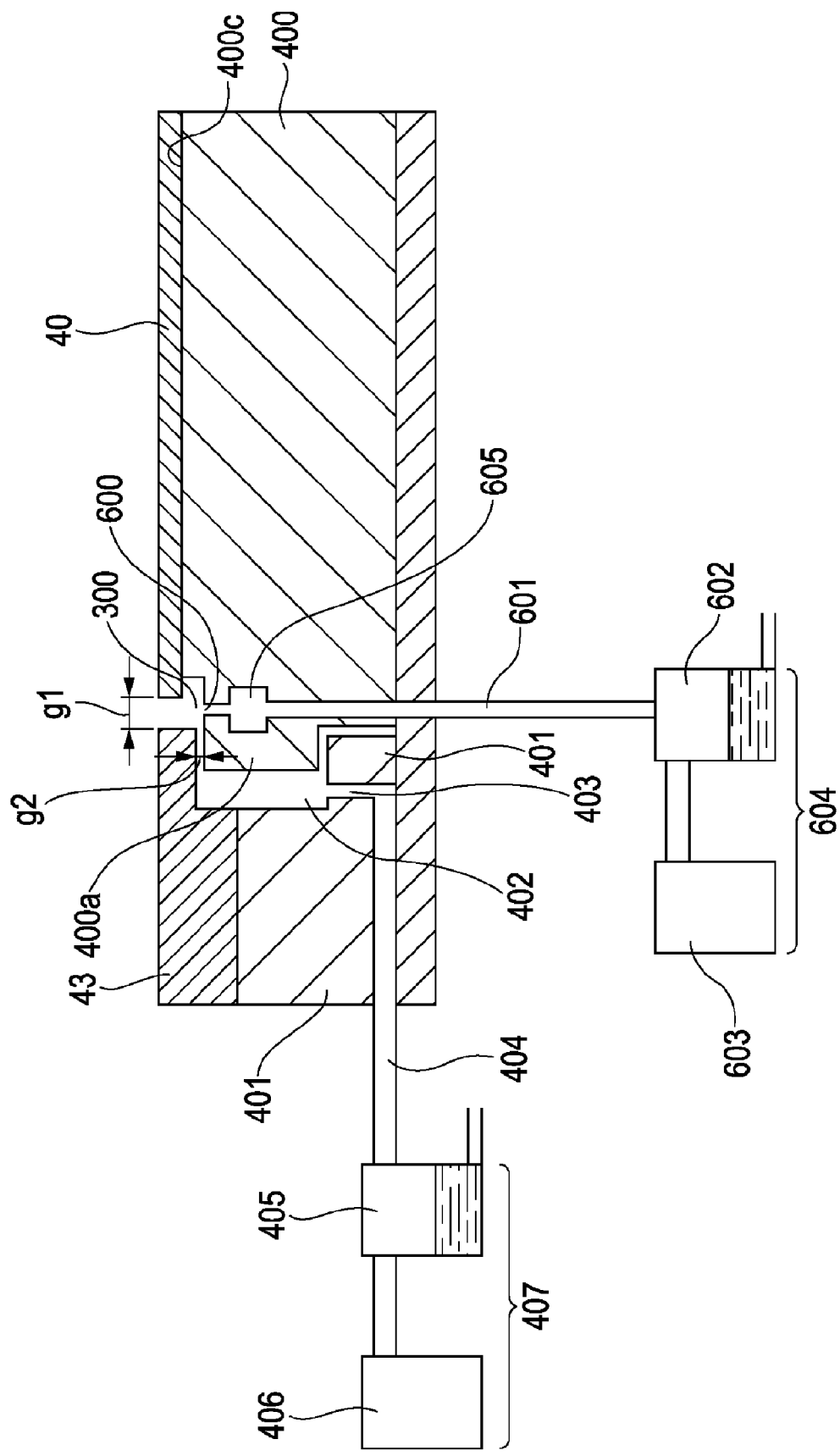
FIG. 3 is a schematic cross-sectional view of a part around a wafer in an exposure apparatus according to a third embodiment of the present invention.

Now, referring to FIG. 3, a third embodiment of the present invention will be described. FIG. 3 is a schematic cross-sectional view of a part around the wafer 40 in an exposure apparatus according to the third embodiment.

The exposure apparatus of the third embodiment can collect the liquid LW that has gathered in the gutter 300 more effectively than in the case of the exposure apparatuses in the first and second embodiments. By collecting the liquid LW that has gathered in the gutter 300, the liquid LW can be prevented from spreading over the wafer 40 and the support plate 43 while the wafer stage 41 is being moved.

A liquid collecting port 600 is provided in the extension 400a of the wafer holder 400. The liquid LW that has fallen into the gutter 300 is collected through the liquid collecting port 600. In the third embodiment, the liquid collecting port 600 is constituted by a number of pinholes annularly surrounding the wafer 40. The pinholes each have a diameter of about 0.1 mm to 3 mm. The pinholes communicate with a space 605. The space 605 is provided below the pinholes and concentrically with the wafer 40. The liquid LW flows into the space 605 through the pinholes. By giving a lyophilic characteristic to the inner walls of the pinholes, the liquid LW can be collected effectively. In the third embodiment, the liquid collecting port 600 constituted by a plurality of pinholes is used for collecting the liquid LW. Instead, the liquid LW can also be collected by using porous members disposed around the wafer 40 likewise.

A suction device 604 is connected to the space 605 through a collecting tube 601. The suction device 604 is constituted by a pressure reduction source 603 and a gas-liquid separation tank 602. The suction device 604 produces a negative pressure in the gas-liquid separation tank 602 with respect to the ambient pressure by activating the pressure reduction source 603, thereby collecting the liquid LW through the collecting tube 601 into the gas-liquid separation tank 602.

Next, a method for controlling the suction device will be described. The suction device 604 is controlled by the control unit 130 in such a manner as to produce different suction forces between during execution of exposure on the wafer 40 and during non-execution of exposure. During execution of exposure, the suction device is not activated and the liquid LW that has fallen into the gutter 300 is naturally collected into the liquid collecting port 600 because of gravity and capillary force. In this case, since the liquid LW is not exposed to an environment having a reduced pressure, vaporization of the liquid LW is never promoted. In contrast, during non-execution of exposure, the control unit 130 activates the pressure reduction source 603 of the suction device 604, whereby the liquid LW is subjected to forced suction with a reduced pressure applied through the liquid collecting port 600. In this case, vaporization of the liquid LW absorbs heat from the wafer holder 400 and may trigger thermal deformation of the wafer holder 400. However, such deformation does not cause degradation of exposure accuracy because exposure is not executed in the foregoing sequence. According to the above description, the control unit 130 does not activate the suction device 604 during execution of exposure. However, it is not necessary to completely stop the operation of the suction device 604. The suction device may be activated with a small suction force. For example, the control unit 130 that controls the suction device 604 can adjust the pressure in the gas-liquid separation tank 602 so as to make the suction force during execution of exposure smaller than that during non-execution of exposure, thereby maintaining the amount of vaporization of the liquid LW during execution of exposure within an allowable range.

To summarize, by providing the liquid collecting port 600 in the extension 400a of the wafer holder 400, the liquid LW can be removed effectively from the gutter 300. Further, by controlling the pressure reduction source 603 using the control unit 130, the influence of heat absorption by vaporization occurring during collection of the liquid LW can be suppressed.

Fourth Embodiment

Devices such as semiconductor devices and liquid crystal display devices are manufactured through a step for exposing a substrate (a wafer, a glass plate, or the like), onto which a photosensitive agent is applied, by using the exposure apparatus according to any of the above-described embodiments, a step for developing the substrate, and other known steps.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2007-206531 filed Aug. 8, 2007, which is hereby incorporated by reference herein in its entirety.

What is claimed is:

1. An exposure apparatus that exposes a substrate to light via liquid, the apparatus comprising:

a substrate stage configured to hold the substrate and to be moved, wherein the substrate stage includes a plate;

a substrate holder disposed on the plate and configured to hold the substrate; and a support-plate holder disposed on the plate separately from the substrate holder and configured to hold a support plate so that the support plate surrounds the substrate held by the substrate holder, wherein the substrate holder includes an extension having a surface facing a back surface of the support plate held by the support-plate holder, the gap between the back surface of the support plate and the surface of the extension being smaller than the gap between the substrate and the support plate, and wherein the support-plate holder is provided with a collecting port therein through which liquid that has entered a gap between the back surface of the support plate and the surface of the extension is collected.

2. The exposure apparatus according to claim 1, wherein the extension is provided with a collecting port therein through which liquid that has entered a gap between the substrate and the support plate is collected, the apparatus further comprises:

a suction device configured to apply suction to the liquid through the collecting port in the extension, during non-execution of exposure of the substrate, the liquid that has entered the gap between the substrate and the support plate is forcibly collected through the collecting port in the extension by using the suction device, and during execution of exposure of the substrate, the liquid that has entered the gap between the substrate and the support plate is naturally collected through the collecting port in the extension due to gravity and capillary force.

3. The exposure apparatus according to claim 1, wherein the surface of the extension facing the back surface of the support plate is at a level below a surface of the substrate holder on which the substrate is held.

4. The exposure apparatus according to claim 3, wherein a portion of the support plate facing the extension is thicker than the substrate.

5. A method of manufacturing a device, the method comprising:

exposing a substrate to light by using the exposure apparatus according to claim 1;

developing the exposed substrate; and processing the developed substrate to manufacture the device.

* * * * *